US012674487B2

(12) United States Patent
Pekar et al.

(10) Patent No.: US 12,674,487 B2
(45) Date of Patent: Jul. 7, 2026

(54) METHODS AND SYSTEMS OF COMPRESSOR CONTROL WITH SURGE AVOIDANCE AND RESPONSE

(71) Applicant: Garrett Transportation I Inc., Torrance, CA (US)

(72) Inventors: Jaroslav Pekar, Pacov (CZ); Daniel Youssef, Brno (CZ)

( * ) Notice: Subject to any disclaimer, the term of this patent is extended or adjusted under 35 U.S.C. 154(b) by 0 days.

(21) Appl. No.: 19/032,778

(22) Filed: Jan. 21, 2025

(65) Prior Publication Data

US 2025/0164568 A1 May 22, 2025

Related U.S. Application Data

(63) Continuation of application No. 18/496,763, filed on Oct. 27, 2023, now Pat. No. 12,241,473.

(Continued)

(51) Int. Cl.
*F04D 27/02* (2006.01)
*B60L 3/00* (2019.01)
(Continued)

(52) U.S. Cl.
CPC ........ *F04D 27/0223* (2013.01); *B60L 3/0046* (2013.01); *B60L 50/60* (2019.02); *B60L 53/62* (2019.02); *B60L 53/66* (2019.02); *B60L 58/12* (2019.02); *B60L 58/16* (2019.02); *B60L 58/26* (2019.02); *C22C 21/10* (2013.01); *F04D 27/001* (2013.01); *F04D 27/0261* (2013.01); *F04D 29/285* (2013.01); *F16C 17/024* (2013.01); *F16C 43/02* (2013.01); *G01R 31/367* (2019.01); *G01R 31/3835* (2019.01);

*G01R 31/389* (2019.01); *G01R 31/396* (2019.01); *H01M 10/486* (2013.01); *H01M 10/613* (2015.04); *H01M 10/625* (2015.04); *H01M 10/633* (2015.04); *H01M 10/6569* (2015.04); *H02J 7/82* (2026.01); *H02J 7/933* (2026.01); *H02J 7/971* (2026.01); *H02J 7/977* (2026.01); *H02M 1/0054* (2021.05); *H02M 7/003* (2013.01); *H02M 7/537* (2013.01); *H05K 1/0206* (2013.01); *H05K 1/0243* (2013.01); *H05K 1/0265* (2013.01); *H05K 1/18* (2013.01); *H10W 90/00* (2026.01); *B60L 2240/545* (2013.01); *F05D 2220/40* (2013.01);
(Continued)

(58) Field of Classification Search
None
See application file for complete search history.

(56) References Cited

U.S. PATENT DOCUMENTS

| | | | |
|---|---|---|---|
| 10,612,829 B2 * | 4/2020 | Carballo | F25D 17/042 |
| 12,304,353 B2 * | 5/2025 | Huang | B60L 1/003 |

(Continued)

*Primary Examiner* — Juan G Flores
(74) *Attorney, Agent, or Firm* — BelayIP

(57) ABSTRACT

Methods and systems for surge control in a compressor system. A recirculation valve position may be actuated in response to identified conditions of potential surge, determined from a compressor map. Recirculation valve position may be controlled by calculating distance of current operating state to a surge line and using proportional integral control to manage the distance. Compressor speed command may be derated in response to identified surge, determined from one of speed fluctuations of the compressor speed, or variance of a compressor speed tracking error.

13 Claims, 8 Drawing Sheets

Related U.S. Application Data

(60) Provisional application No. 63/517,577, filed on Aug. 3, 2023.

(51) Int. Cl.

| | | |
|---|---|---|
| *B60L 50/60* | (2019.01) | |
| *B60L 53/62* | (2019.01) | |
| *B60L 53/66* | (2019.01) | |
| *B60L 58/12* | (2019.01) | |
| *B60L 58/16* | (2019.01) | |
| *B60L 58/26* | (2019.01) | |
| *C22C 21/10* | (2006.01) | |
| *F04D 27/00* | (2006.01) | |
| *F04D 29/28* | (2006.01) | |
| *F16C 17/02* | (2006.01) | |
| *F16C 43/02* | (2006.01) | |
| *G01R 31/367* | (2019.01) | |
| *G01R 31/3835* | (2019.01) | |
| *G01R 31/389* | (2019.01) | |
| *G01R 31/396* | (2019.01) | |
| *H01M 10/48* | (2006.01) | |
| *H01M 10/613* | (2014.01) | |
| *H01M 10/625* | (2014.01) | |
| *H01M 10/633* | (2014.01) | |
| *H01M 10/6569* | (2014.01) | |
| *H02J 7/82* | (2026.01) | |
| *H02J 7/90* | (2026.01) | |
| *H02M 1/00* | (2006.01) | |
| *H02M 7/00* | (2006.01) | |
| *H02M 7/537* | (2006.01) | |
| *H05K 1/02* | (2006.01) | |
| *H05K 1/18* | (2006.01) | |
| *H10W 90/00* | (2026.01) | |

(52) U.S. Cl.
CPC .... *F05D 2300/121* (2013.01); *F16C 2226/00* (2013.01); *H01M 2220/20* (2013.01); *H05K 2201/10015* (2013.01); *H05K 2201/10166* (2013.01)

(56) References Cited

U.S. PATENT DOCUMENTS

| | | | | |
|---|---|---|---|---|
| 2018/0299144 A1* | 10/2018 | Carballo | .............. | F25D 11/00 |
| 2022/0120486 A1* | 4/2022 | Kim | .............. | F04D 27/0238 |
| 2023/0034110 A1* | 2/2023 | Huang | .............. | B60L 58/26 |

\* cited by examiner

METHODS AND SYSTEMS OF COMPRESSOR CONTROL WITH SURGE AVOIDANCE AND RESPONSE

CROSS REFERENCE TO RELATED APPLICATIONS

The present application is a continuation of U.S. patent application Ser. No. 18/496,763, filed Oct. 27, 2023, titled METHODS AND SYSTEMS OF COMPRESSOR CONTROL WITH SURGE AVOIDANCE AND RESPONSE, which claims the benefit of and priority to U.S. Provisional Patent Application No. 63/517,577, titled CONTROL SYSTEMS, METHODS AND DEVICES, filed on Aug. 3, 2023, the disclosure of which is incorporated herein by reference.

BACKGROUND

Compressors are being used in many industries and are used in many different applications, including in the automotive industry. For example, centrifugal compressors may be used in in vapor cycle cooling systems for cooling batteries in battery electric vehicles. Surge is a phenomenon that may degrade the performance or create fatal damage for any compressor, and centrifugal compressors can be sensitive to surge. Therefore, centrifugal compressors must be carefully monitored and controlled to avoid operation close to or in surge conditions.

A typical surge detector usually depends on one or two measured variables in a single method for surge identification or prevention. More robust and reliable methods are desired, using multiple methods. Moreover, while surge detection is quite crucial for preventing hardware damage, it is also preferable to provide ways to expand the operating region of the compressor. New and alternative methods and systems for compressor control with surge avoidance and response are desired.

OVERVIEW

This invention proposes a combination of multiple methods for robust and reliable detection and avoidance of surge for centrifugal compressors driven by electric machines. For example, the invention may be used with a centrifugal compressor driven by a Permanent Magnet Synchronous Motor (PMSM), specifically in connection with the application of centrifugal compressor in electric vehicle cooling system, or flying vehicles like the proposed air taxi and/or other electric vehicles.

A first illustrative and non-limiting example takes the form of a vapor cycle cooling system, the system using a circulating fluid and comprising a recirculation valve (RCV), a condenser, an expansion valve, an evaporator, a compressor motor, a compressor coupled to the motor, an electronic control unit (ECU), and a plurality of pressure, temperature and motor sensors, the ECU configured to control the compressor motor by receiving a commanded speed, and controlling current to the motor or torque generated by the motor, the ECU further configured to perform a method of controlling compressor surge comprising: determining a parameter of motor operation; obtaining a circulating fluid parameter upstream of the compressor, obtaining a circulating fluid parameter downstream of the compressor, obtaining mass flow of the circulating fluid through the compressor; evaluating a likelihood of compressor surge by: a) analyzing variance or oscillation of the parameter of motor operation to identify compressor surge; and b) analyzing the circulating fluid parameter upstream of the compressor, the circulating fluid parameter downstream of the compressor, and the mass flow of the circulating fluid through the compressor, using a compressor map, to identify potential surge conditions; and: if compressor surge is identified at a), derating compressor speed to reduce compressor speed below the commanded compressor speed; or if potential surge conditions are identified at b), actuating the RCV to mitigate potential surge.

Additionally or alternatively, the parameter of motor operation is one of motor speed, motor torque, and motor current. Additionally or alternatively, the motor operates at an actual motor speed; the ECU determines a speed tracking error as a difference between the commanded speed and the actual motor speed; and the ECU is configured to perform a) by analyzing a variance of the speed tracking error, and comparing the variance of the speed tracking error to a threshold.

Additionally or alternatively, the ECU is configured to perform a) by analyzing motor speed to determine a degree of oscillation of the motor speed, and identifying surge when the degree of oscillation of the motor speed exceeds a threshold. Additionally or alternatively, the ECU is configured to perform a) by analyzing motor torque to determine a degree of oscillation of the motor torque, and identifying surge when the degree of oscillation of the motor torque exceeds a threshold. Additionally or alternatively, the ECU is configured to perform a) by analyzing motor current to determine a degree of oscillation of the motor current, and identifying surge when the degree of oscillation of the motor current exceeds a threshold.

Additionally or alternatively, the ECU is configured to perform a) by analyzing motor speed to determine a variance of the motor speed, and identifying surge when the variance of the motor speed exceeds a threshold. Additionally or alternatively, the ECU is configured to perform a) by analyzing motor torque to determine a variance of the motor torque, and identifying surge when the variance of the motor torque exceeds a threshold. Additionally or alternatively, the ECU is configured to perform a) by analyzing motor current to determine a variance of the motor current, and identifying surge when the variance of the motor current exceeds a threshold.

Additionally or alternatively, the circulating fluid parameter upstream of the compressor is an upstream pressure; the circulating fluid parameter downstream of the compressor is a downstream pressure; and the ECU is configured to perform b) by determining a compressor pressure ratio using the upstream pressure and the downstream pressure. Additionally or alternatively, the ECU is configured to perform b) by calculating a distance from a current operating point to a surge line on the compressor map. Additionally or alternatively, the ECU is configured to determine that potential surge conditions are not present if the distance is greater than a first threshold. Additionally or alternatively, the ECU is configured to actuate the RCV to mitigate potential surge by using the distance as an input to a proportional-integral controller.

A further illustrative and non-limiting example takes the form of a battery electric or hybrid vehicle comprising a battery configured to provide motive power to the vehicle and the vapor cycle cooling system of any of the preceding examples, wherein the vapor cycle cooling system is coupled to the battery to provide thermal management thereto.

Another illustrative and non-limiting example takes the form of a method of controlling a recirculation valve in a compressor system, the compressor having an inlet and an outlet, and the recirculation valve coupled to the compressor system to controllably deliver fluid to the compressor inlet to increase mass flow therethrough, wherein the compressor is operable within conditions determined by a compressor map having a surge line; the method comprising: estimating or sensing a mass flow rate through the compressor; estimating or sensing each of a first pressure upstream at the compressor inlet, and a second pressure at the compressor outlet; calculating a distance from a current operating point, using the mass flow rate and a ratio of the first and second pressures, to the surge line on the compressor map; and controlling position of the recirculation valve with a proportional-integral controller taking the distance as an input.

Additionally or alternatively, the compressor is coupled to a compressor motor, and the system including an engine control unit (ECU) which is configured to perform the step of calculating the distance, the method further comprising: the ECU controlling the compressor motor by receiving a commanded speed, and controlling current to the motor or torque generated by the motor; the ECU determining a parameter of motor operation; the ECU analyzing variance or oscillation of the parameter of motor operation to identify compressor surge; and the ECU determining that compressor surge is occurring and derating compressor speed to reduce compressor speed below the commanded compressor speed; wherein the parameter of motor operation is one of motor speed, motor torque, and motor current.

Additionally or alternatively, the motor operates at an actual motor speed; the ECU determines a speed tracking error as a difference between the commanded speed and the actual motor speed; and the ECU is configured to identify compressor surge by analyzing a variance of the speed tracking error, and comparing the variance of the speed tracking error to a threshold.

Additionally or alternatively, the ECU is configured to identify compressor surge by analyzing motor speed to determine a degree of oscillation of the motor speed, and identifying surge when the degree of oscillation of the motor speed exceeds a threshold. Additionally or alternatively, the ECU is configured to identify compressor surge by analyzing motor torque to determine a degree of oscillation of the motor torque, and identifying surge when the degree of oscillation of the motor torque exceeds a threshold. Additionally or alternatively, the ECU is configured to identify compressor surge by analyzing motor current to determine a degree of oscillation of the motor current, and identifying surge when the degree of oscillation of the motor current exceeds a threshold.

Additionally or alternatively, the ECU is configured to perform a) by analyzing motor speed to determine a variance of the motor speed, and identifying surge when the variance of the motor speed exceeds a threshold. Additionally or alternatively, the ECU is configured to perform a) by analyzing motor torque to determine a variance of the motor torque, and identifying surge when the variance of the motor torque exceeds a threshold. Additionally or alternatively, the ECU is configured to perform a) by analyzing motor current to determine a variance of the motor current, and identifying surge when the variance of the motor current exceeds a threshold.

This overview is intended to provide an introduction to the subject matter of the present patent application. It is not intended to provide an exclusive or exhaustive explanation.

The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
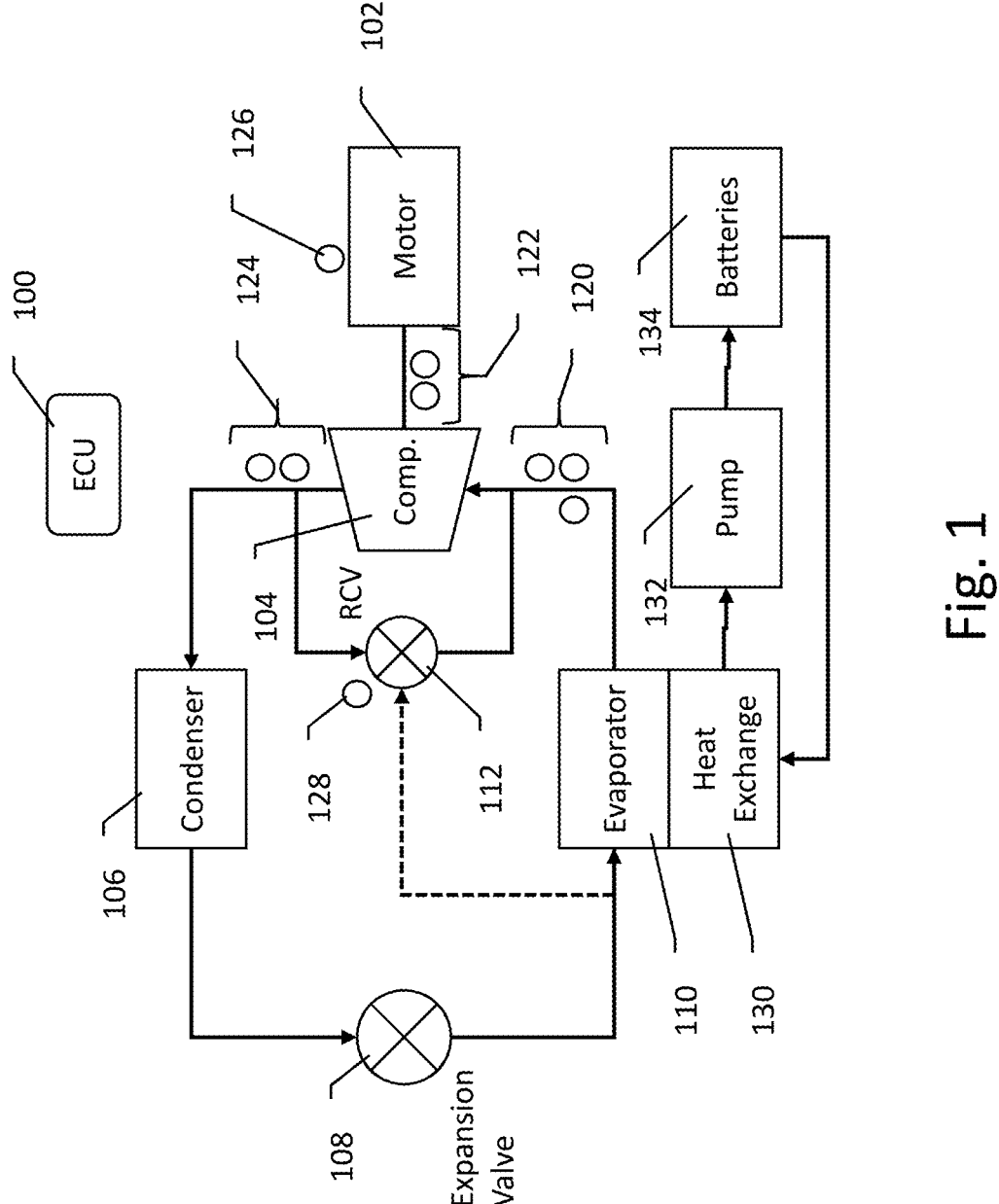
FIG. 1 shows an illustrative vapor cycle cooling system.

FIG. 1 shows an illustrative vapor cycle cooling system. An electronic control unit (ECU) 100, which may be a system controller, is shown as controlling operation, providing a commanded compressor speed setpoint for use by a motor 102. The ECU 100 may take many forms, including a microcontroller or microprocessor, coupled to a memory storing readable instructions for performing methods as described herein, as well as providing configuration of the ECU 100 for the various examples that follow. The ECU 100 may include one more application-specific integrated circuits (ASIC) to provide additional or specialized functionality, such as, without limitation a signal processing ASIC that can filter received signals from one or more sensors using digital filtering techniques. Logic circuitry, state machines, and discrete or integrated circuit components may be included as well. The skilled person will recognize the many different hardware implementations that are available for an ECU, including without limitation, those illustrated in US PG Pat. Pub. 2022/0343702, titled ADVANCED CONTROL FRAMEWORK FOR AUTOMATIC SYSTEMS, the disclosure of which is incorporated herein by reference.

The motor 102 provides torque to a compressor 104, which compresses the circulating fluid (typically a refrigerant arriving at the compressor as a low-pressure vapor) that passes to a condenser 106 as high-pressure vapor. At the condenser 106 the high-pressure vapor is converted to high pressure liquid, with heat given off. From the condenser 106 the high-pressure liquid passes to an expansion valve 108 and is allow to expand to low pressure liquid. The low-pressure liquid is routed to an evaporator 110, where it takes in heat to become a low-pressure vapor again.

The evaporator 110 may operate in a heat exchanger 130. The heat exchanger 130 may be part of a cooling system having a coolant that loses heat to the circulating fluid. The coolant may circulate through pump 132 to a vehicle system that requires thermal management, such the batteries 134 of an electric or hybrid electric vehicle. The batteries 134 may be configured to power a motor that provides motive power to the vehicle.

A recirculating valve (RCV) is present at 112, and allows recirculation of higher-pressure gas downstream of the compressor (that is, after the compressor outlet) back to the compressor 104 inlet or a location upstream of the compressor 104 inlet. The RCV 112 may be used selectively to prevent surge, as further described below. As illustrated by the broken line, the RCV 112 may instead be coupled to the evaporator inlet, rather than the compressor outlet, for example and without limitation. Any location other than the compressor inlet may be linked to the RCV 112 to provide mass flow through the RCV to prevent or limit surge, as desired.

Numerous sensing apparatuses are distributed throughout the system. Sensors 120 can include a temperature sensor, pressure sensor, and mass flow sensor monitoring the temperature, pressure and quantity of gas entering the compressor 104. Torque applied by the motor 102, as well as compressor drive shaft speed can be monitored by hardware or virtual sensors 122. Sensors 124 monitor the temperature and pressure as fluid exits the compressor. Current flow to the motor may be monitored by another sensor 126. Position of the RCV 112, or the actuator to the RCV, may be monitored by a position sensor 128, if desired. As used herein, "virtual" sensor may be implemented as a set of machine-readable instructions (software or firmware for example) which use one or more models to infer a parameter value from other sensed parameters in a system. For example, a compressor speed can be determined by a virtual sensor with the use of a model of the compressor and measurements of mass flow into the compressor, and pressure and/or temperature (and other characteristics if desired) of a fluid or gas both upstream (going to the compressor inlet) and downstream (exiting the compressor outlet) of the compressor. Virtual sensors can be used throughout the system, as desired.

The system setup has various additional elements. The motor 102 may include its own controller, having access to a plurality of component level variables including motor speed (which directly relates to compressor speed), motor torque, and motor current. System level variables may include, for example, those from sensors that are not directly communicated to the controller of motor 102, for example, compressor inlet and compressor outlet pressures and temperatures, and/or compressor mass flow. In some example, the various sensors 120, 122, 124, 126, 128 may be coupled to a controller area network bus (or any other bus/common communications structure), as well as the motor 102, making the system level signals available to the controller for motor 102, if desired. In some examples, the controller for motor 102 may make determinations identifying surge and, in response, reducing compressor speed by derating the compressor speed command, using locally generated signals including compressor speed and/or torque data, while the ECU 100 may make determinations identifying potential surge conditions and modulate position of the RCV, using system level data such as the pressure ratio across the compressor 104 (ratio of inlet and outlet pressures) and mass flow thereof, each input to a compressor map having a surge line defining operating states that may lead to surge. Surge may occur, for example, if a valve (such as the expansion valve) closes, causing mass flow to drop and creating potential surge conditions. A range of controlled actions and/or uncontrolled failure modes (clogging, breakdown, freezing, aging) can introduce potential surge conditions in the system.

Figure 2:
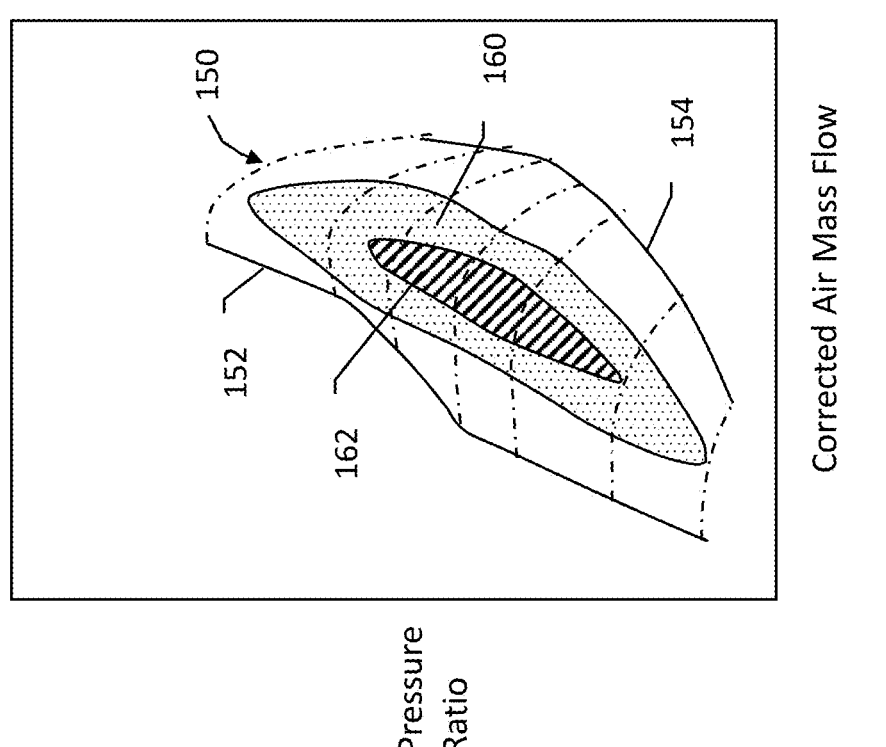
FIG. 2 shows a compressor map.

FIG. 2 shows an illustrative and simplified compressor map. The compressor map uses corrected air mass flow as the X-axis, and the pressure ratio of the compressor as the Y-axis. Several compressor speed lines 150 cross the graph and are associated with different compressor speeds. Boundary conditions are included, with a surge line 152 on the left side of the drawing, and a choke line 154 on the right side of the drawing. The surge 152 line indicates the maximum pressure the compressor can generate at a given mass flow. The choke line 154 indicates the maximum amount of mass flow at a given pressure ratio. Efficiency islands 160, 162 indicate operating conditions associated with higher compressor efficiency. The compressor map in FIG. 2 is simplified; an actual compressor map may include more lines to provide greater granularity.

Operation outside of boundaries 152, 154 is avoided to prevent degraded (and/or unpredictable) operation as well as potential damage to components. In particular, the surge line 152 indicates conditions in which the compressor may not be able to sustain fluid flow and may suffer backflow, causing significant vibrations that can in turn damage compressor blades and other parts of the system. As a result, precautions are taken to prevent or avoid surge, such as by staying well away from the surge line, thus sacrificing portions of the operational map to prevention.

For a given installation, testing can be performed at a test station to establish the compressor map. The system is then loaded with data representative of the compressor map, whether as a look-up table, a set of equations defining a model, or in any other suitable fashion. The data or models, for example, may be stored in tangible and non-transitory memory of or linked to an ECU 100 (FIG. 1).

Figure 3:
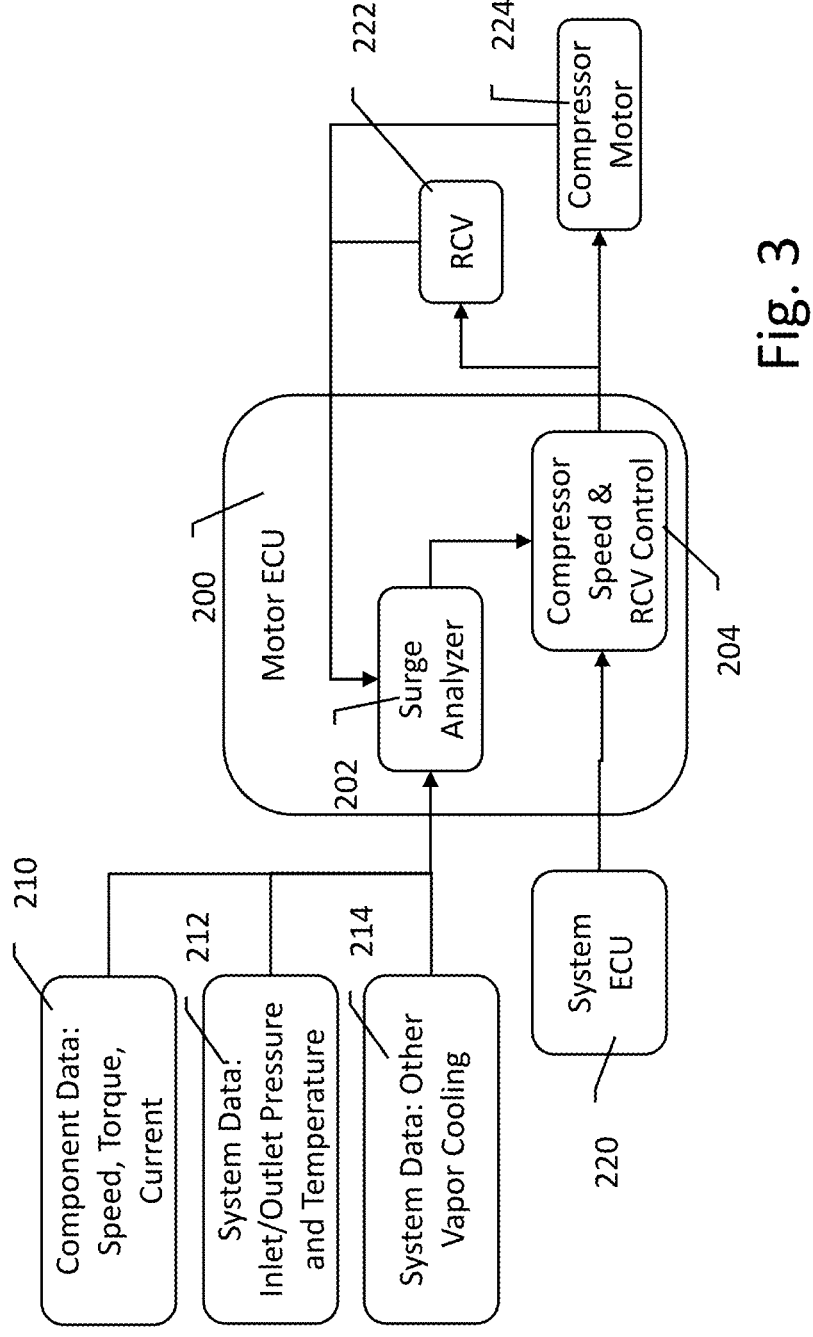
FIG. 3 illustrates a control system in block form.

FIG. 3 illustrates a control system in block form. FIG. 3 illustrates a motor ECU at 200. Thus, in this example, some system level parameters may be analyzed by the motor ECU 200 to both mitigate and prevent surge. The motor ECU 200 includes a surge analyzer 202, and a compressor speed and RCV control block 204. The surge analyzer is configured to receive component data signals, including for example motor/compressor speed, torque, and/or current, as indicated at 210. Using a bus connection, or by receiving communications from a system ECU 220, the motor ECU 200 receives at least some system data, including compressor inlet or outlet pressure and temperature, as indicated at 212. The data may be obtained from physical sensors, or may be estimated by a system observer that uses one or more models to estimate temperature, pressure, etc. at select locations. Further system data may provide information about additional disturbances that may also affect a probability of surge, such as other vapor cooling data 214 for example, expansion valve command and/or position signals, and signals related to the condenser and/or evaporator (external fan speed, for example). The surge analyzer also receives data from the RCV 222, which may include RCV position data or RCV command.

The surge analyzer 202 uses the signals it receives to determine each of a) whether surge is currently occurring, and b) whether operations are close to a surge line. The surge analyzer 202 provides control signals to a compressor speed and RCV control block 204. If the system is operating near a surge boundary, an RCV control signal is issued from block 204 to the RCV 222 to, for example, open the RCV and/or, if operation has moved away from the surge boundary, the control signal from 204 to 222 may be to close the RCV. If the system is currently in surge, on the other hand, the surge analyzer 202 may cause the compressor speed and RCV control block 204 to derate the compressor speed command received from the system ECU 220, and issue a different command, such as a lower speed or an off signal, to the compressor motor 224. If no surge is detected, the compressor speed command from the system ECU may pass, unchanged, through block 204 to the compressor motor 224.

Figure 4:
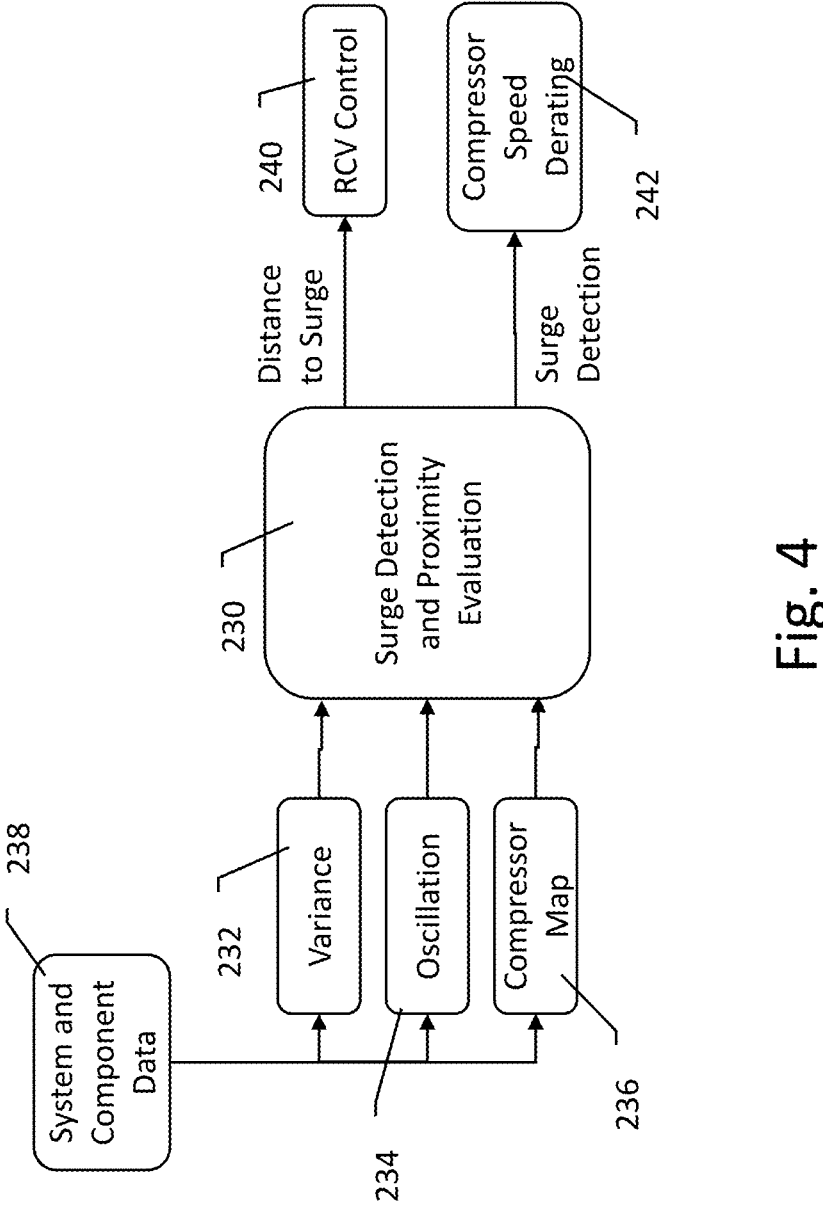
FIG. 4 shows an illustrative surge analyzer.

FIG. 4 shows an illustrative surge analyzer. A surge detection and proximity evaluation block 230 receives outputs from three separate analysis. Block 232 analyzes variance, as shown below in FIG. 5. Variance 232 may compare, for example, and without limitation, sampled compressor and/or motor speed over time to determine variance of speed directly. In another example, variance 232 may compare measured motor/compressor speed to a speed command signal provided to the motor, yielding a speed tracking error. Variance of the speed tracking error can be monitored instead of monitoring speed itself, which may remove changes to the speed command from the analysis of variance 232. Variance 232 may instead track other signals, such as power, torque, or current consumed by the compressor motor, any of which may be analyzed to determine variance directly, or by use of a tracking error for any of these other variables. Variance threshold(s) may be set in any suitable way; in some examples, a variance threshold may be determined by monitoring an average value of the variance of a parameter (motor speed, motor current, motor torque, and/or speed tracking error) over time, and setting a threshold in relation to the average such as by setting the threshold to 150%, 200% or some other quantity or ratio above the average.

Figure 6:
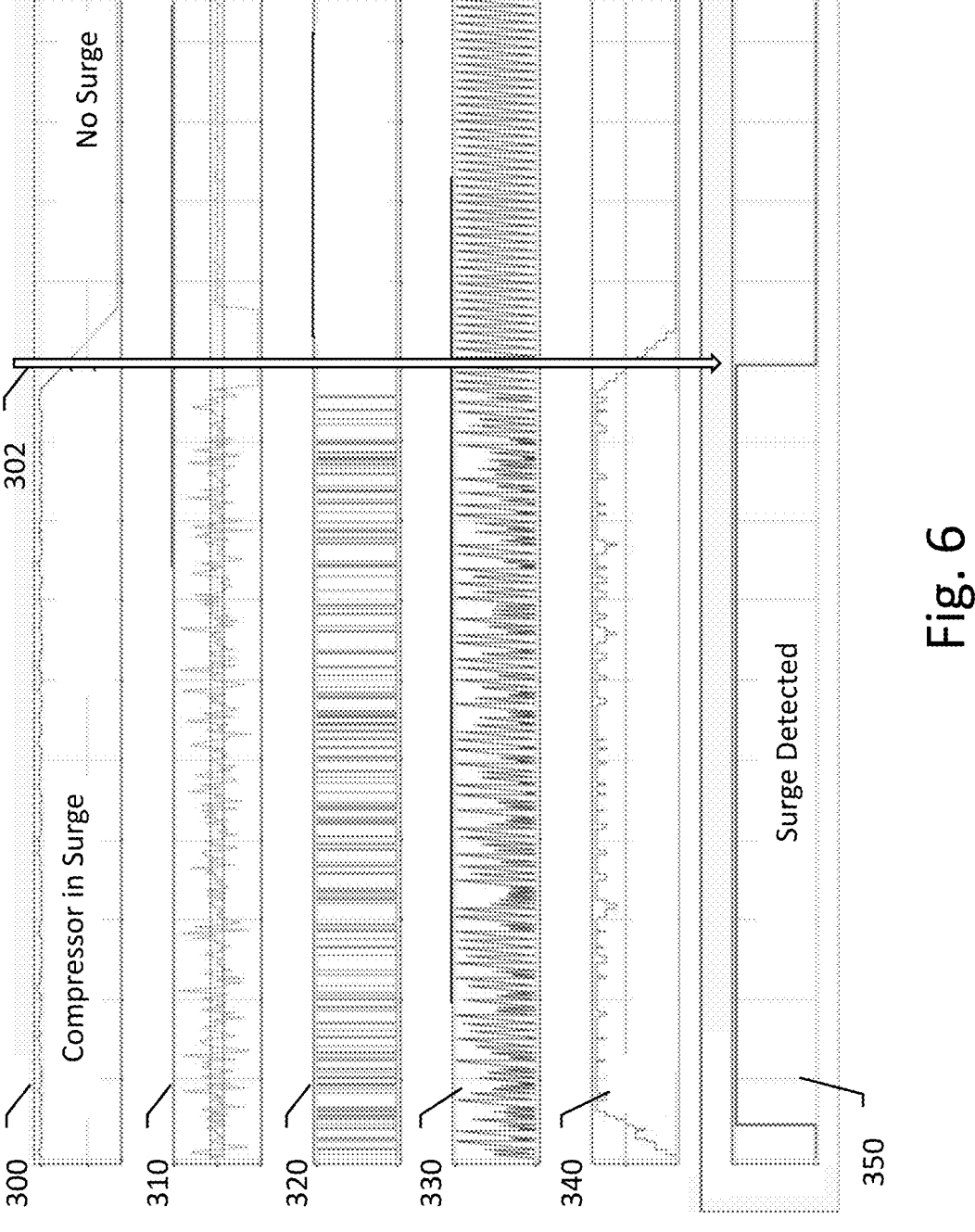

Block 234 monitors oscillation. Oscillation 234 may, for example, focus on motor (compressor) speed, which may vary about an average or setpoint over time. When surge occurs, however, the motor speed begins to vary more than under nominal conditions, as shown in FIG. 6, below. When motor speed changes by more than a threshold within a given period of time, such as from one sample to the next, or across a set of 3-6 samples, this again may be an indication of surge. Oscillations in particular are known to occur with surge conditions. Thus block 234 monitors oscillation including, for example, motor speed oscillation. Oscillation 234 may track other signals, such as power, torque, or current used by the compressor motor, any of which may be analyzed to determine oscillation.

In further examples, blocks 232 and 234 may also be used to monitor oscillation and/or variance of system variables that can be monitored to identify ongoing surge. For example, if the compressor motor is managed to a setpoint, the control over the compressor motor may mute oscillation and/or variance metrics, however, the current to the motor will still show such changes over time. Thus compressor motor current may instead be monitored in either of 232 or 234. If a mass flow sensor is positioned at the compressor inlet or outlet to monitor mass flow, the output of this sensor may be affected when surge occurs, such as by showing higher variance or oscillations than would be expected under normal conditions; thus, the mass flow sensor may be monitored at 232 and/or 234 instead or in addition to speed. Compressor and/or compressor motor temperature may be monitored, if desired, as both must work harder when surge occurs. A vibration sensor may be positioned on the compressor, compressor motor, drive shaft, or elsewhere in the system (typically close to the compressor though), as surge, when it occurs, can cause vibrations that are possible to monitor with a motion sensor. Rather than, or in addition to surge monitoring blocks 232, 234, a motion sensor monitor may be provided.

Block 236 instead monitors for conditions in which surge is possible or likely. For example, a compressor map is noted at 236. Knowing the operating conditions, such as, mass flow, compressor pressure ratio, and compressor speed, the compressor map can be referenced to determine distance to the surge line, as illustrated below in FIG. 7.

The surge detection and proximity evaluation block 230 may use the outputs from 232 and 234 to determine whether surge is currently ongoing. If so, compressor speed may be derated or reduced, at 242, by replacing the compressor speed command with a lower control setpoint or even by turning off the compressor motor or applying a compressor or motor brake signal, as desired. The surge detection and proximity evaluation block 230 uses the output from block 236 to determine whether current conditions make surge likely or possible. If so, a control signal is sent to the RCV controller 240 to open the RCV. In some examples, rather than an Open/Close signal, a control setpoint is generated and either analyzed further internally to the evaluation block 230, or at the RCV control 240, in which distance to surge is used as a setpoint for proportional, integral and derivative (PID) control or for proportional-integral (PI) control.

Figure 5:
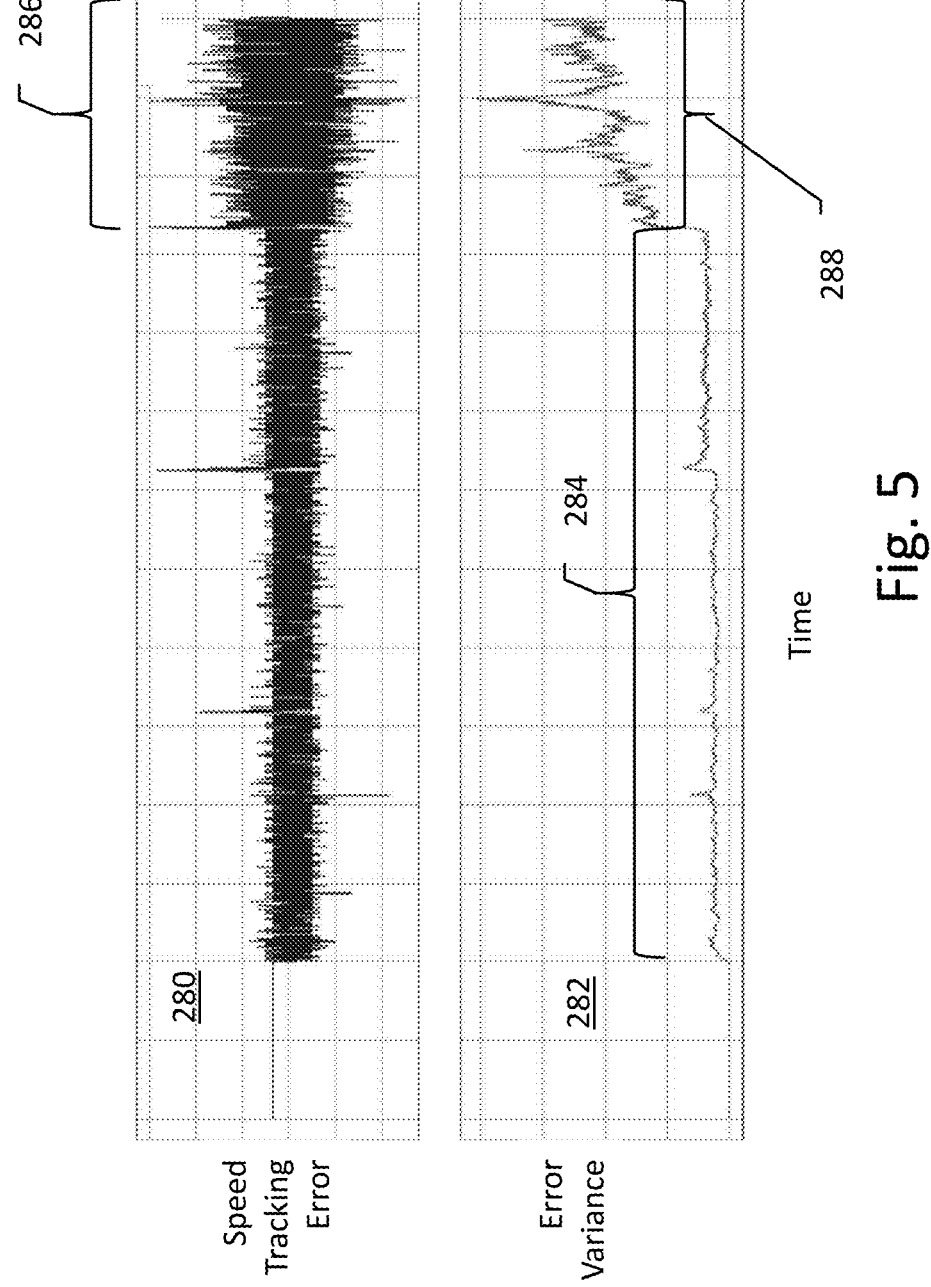
FIGS. 5-7 each show illustrative analyses of surge or potential surge.
Figure 7:
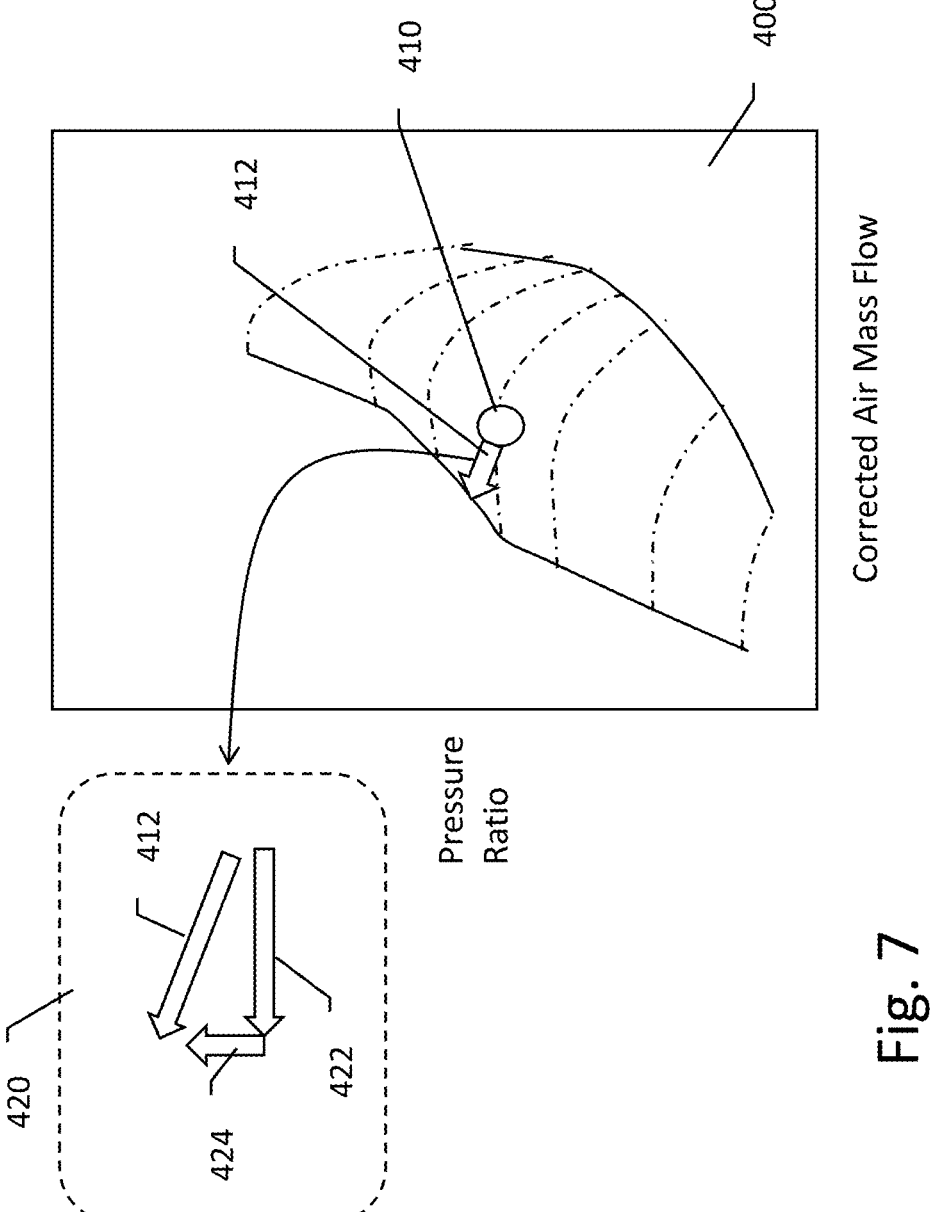

FIGS. 5-7 each show illustrative analyses of surge or potential surge. FIG. 5 shows an example using variance of a metric. The selected metric here is speed, and particularly, speed tracking error of the compressor/motor (assuming here, that the motor speed and compressor speed are the same; if these are different, one or the other may be monitored as desired; often the monitoring is performed by observing drive shaft speed). The speed tracking error is shown at 280, and is the difference between commanded compressor speed and the actual speed of the compressor. Occasional spikes may be observed in the graph at 280, which may be due to changes in the speed command causing brief lags, and then return to the more or less nominal case. At 280, however, it can be seen that the speed tracking error 280 becomes more widely variable. The result is that the error variance, shown at 282, which stays relatively flat for a significant period of time, increases significantly at 288. Either the speed tracking error, or an average of a number of samples thereof, or the error variance, may be used to determine whether surge is taking place. The changes in speed tracking error and variance would arise due to the unpredictable forces on the compressor itself during surge.

The underlying analysis for FIG. 5 may include the following. A non-biased variance and mean value estimator may be used, with filtering if desired. For example, the variance may be determined from Equation 1:

$$\hat{\sigma}_k^2 = B\hat{\sigma}_{k-1}^2 + \frac{1-B}{c}(x_k - \hat{\mu}_k)^2 \qquad \text{\{Equation 1\}}$$

Where the mean value estimator is as shown in Equation 2:

$$\hat{\mu}_k = A\hat{\mu}_{k-1} + (1-A)x_k \qquad \text{\{Equation 2\}}$$

Where A, B, and C are constants derived for control purposes, x is the compressor speed tracking error, and k is the index.

FIG. 6 shows another graphical example. This time, a data-based surge detector is illustrated, using motor/compressor speed oscillation as the monitored signal. At 300, the motor speed is shown, with the example starting with the compressor in a surge state. At 310, an oscillation measurement is illustrated and compared against upper and lower bounds for oscillation. In the example, oscillation is measured as the 20-sample differential in speed, which is then compared against the upper and lower bounds. Each time the oscillation measure crosses from the negative bound to cross the upper bound, this is deemed an oscillation, and a spike is shown at 320.

A healing timer signal is shown at 330. The healing timer periodically decrements the oscillation counter shown at 340, whenever the timer limit is reached. However, if an oscillation spike occurs, the healing timer is reset. The oscillation counter 340 is compared against a surge detection limit. When the oscillation counter 340 exceeds the surge detection limit, the surge state shown at 350 goes high, meaning that surge is detected. In the example, at time 302, shortly after the compressor speed 300 begins to drop, the oscillations stop at 310, so no spikes occur at 320 and the healing timer is able to reach its upper limit, and decrements the oscillation counter. Once the oscillation counter 340 goes below the surge detection limit, the surge state 350 goes low, meaning that surge is no longer detected.

FIG. 7 graphically shows another example. Here, a surge probability monitor is being illustrated. The compressor map is shown at 400. An actual or current operating point is shown at 410. A normalized distance 412 to the surge line 414 can be observed. The "distance" may be understood as shown at the insert 420, a vector 412 having a mass flow component 422, and a pressure ratio component 424. That is, a change in mass flow shown at 422, plus the change in pressure ratio 424, could cause surge. As can be seen, there may be many combinations of change in mass flow and pressure ratio that could bring the operating point 410 closer to surge line 414. In an example, the distance can be calculated as follows:

$$d_N = sqrt\left(A * \Delta r_P^2 + B * \Delta m_c^2\right) \qquad \text{\{Equation 3\}}$$

Where $\Delta r_P$ is change in pressure ratio, and $\Delta m_c$ is change in corrected mass flow, and A and B are constants chosen to normalize the output values and correct for unit conversions; the "distance" may be unit-less if desired. A minimization may also be used to identify the "shortest" distance if the surge line, for example, has curvature making a simple square-root analysis incorrect. Equation 3 is subject to the condition that the combination of $\Delta r_P$ and $\Delta m_c$, relative to the current operating point, would bring the system into surge.

The distance calculation of Equation 3 may be used in a proportional-integral (PI) control process for controlling RCV valve position. The PI controller can be active whenever the distance from Equation 3 is less than a set minimum, and the setpoint for the RCV PI controller may be selected to provide an offset from the surge line. Modelling and/or test stand operations may be used to calibrate a desired offset and/or setpoint for the RCV PI controller, as well as the enabling conditions used by the surge proximity detector. As a result, the RCV valve position can be closed when not in proximity to the surge line, such as when the distance exceeds a first threshold, and when operating conditions trigger the surge proximity detector because the distance is less than the first threshold, the RCV PI controller uses the calibrated offset as its setpoint to maintain a distance from the surge line using RCV actuation. The RCV can be actively managed by opening partially or completely, and modulating the position between full open and full closed. The RCV may include an RCV position sensor to aid in the modulation activity.

Proportional-integral-derivative (PID) control may be used instead. In still other examples, predictive or other control methods (Model Predictive Control, for example) may be used, and a distance calculation such as in FIG. 3 may be used as a penalty or constraint in such analysis by, for example, including a minimum constraint as well as a penalty when the distance is less than a threshold. If desired, the RCV operation may be modeled as well to aid in determining how far open the RCV should be in view of pressure upstream of the RCV (whether at the compressor outlet or elsewhere, in the system such as at the evaporator inlet) and downstream of the RCV, allowing an estimation of RCV flow to be obtained if, for example, a predictive control routine is used.

Figure 8:
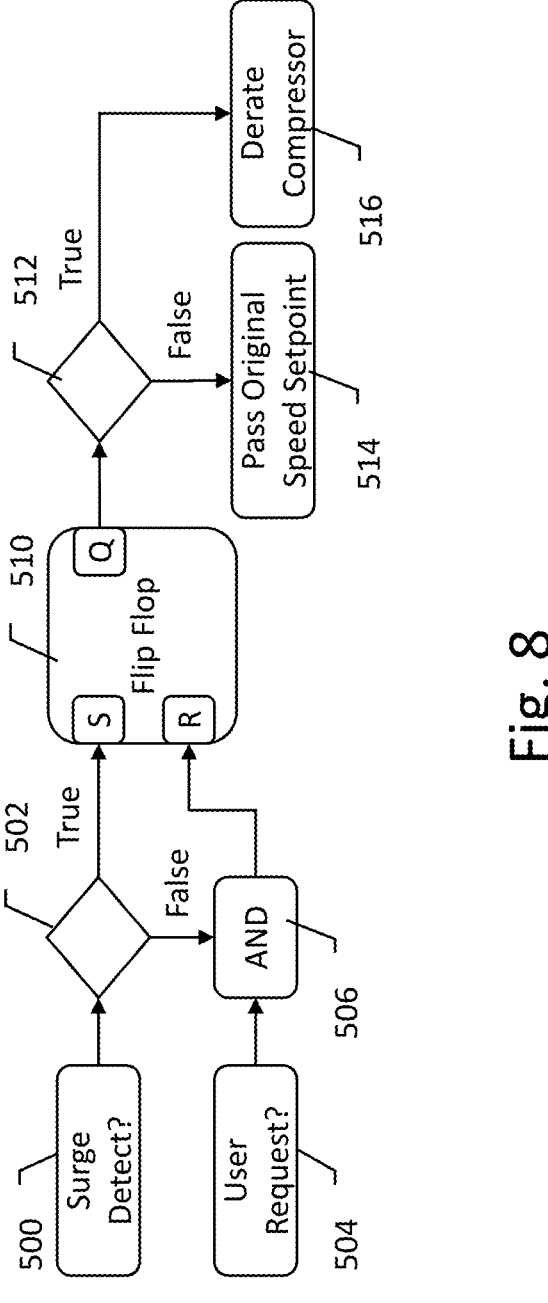
FIG. 8 shows an illustrative compressor speed control signal processor

FIG. 8 shows an illustrative compressor speed control signal processor. The processor receives a signal indicating whether or not surge is detected, as indicate at 500. Logic block 502 feeds forward a signal when surge is detected to the S input of flip flop 510, setting the flip flop 510, making the output Q=1. That output goes to logic block 512, which would then determine a true result and activates block 516, derating the compressor, or reducing the compressor speed command and/or turning the compressor motor off. Reset of the flip flop 510 requires a request, such as a user request or a system controller request, from block 504. If block 504=1, the system still must wait until surge detect 500 goes low in order to satisfy the AND gate 506. Once the output of block 500 is low, and the output of 504 is high, then the false output of 502 combined with block 504 being high will trigger the and gate 506, pushing forward a 1 to the reset, R, of flip flop 510 while input S would also go low. That resets the flip flop, and the output Q would go low, disabling block 516 and enabling block 514, allowing the original speed setpoint to pass to the compressor motor. Other logic approaches may be used, as desired.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A vapor cycle cooling system, the system using a circulating fluid and comprising a recirculation valve (RCV), a condenser, an expansion valve, an evaporator, a compressor motor, a compressor coupled to the motor and having a compressor inlet and a compressor outlet, an electronic control unit (ECU), and a plurality of pressure, temperature and motor sensors, the ECU configured to control the compressor motor by receiving a commanded speed, and controlling current to the motor or torque generated by the motor, the ECU further configured to perform a method of controlling the RCV comprising:

estimating or sensing a mass flow rate through the compressor;

estimating or sensing each of a first pressure upstream at the compressor inlet, and a second pressure at the compressor outlet;

calculating a distance from a current operating point, using the mass flow rate and a ratio of the first and second pressures, to a surge line on a compressor map for the compressor;

controlling position of the RCV with a controller taking the distance as an input;

determining a parameter of motor operation;

analyzing variance or oscillation of the parameter of motor operation to identify compressor surge; and determining whether compressor surge is occurring and, if so, derate compressor speed to reduce compressor speed below the commanded compressor speed; and wherein the parameter of motor operation is one of motor speed, motor torque, and motor current.

2. The vapor cycle cooling system of claim 1, wherein the controller applied a proportional-integral control function.

3. The vapor cycle cooling system of claim 1, wherein the motor operates at an actual motor speed and the ECU is further configured to:

determine a speed tracking error as a difference between the commanded speed and the actual motor speed;

determine whether compressor surge is occurring by analyzing a variance of the speed tracking error, and comparing the variance of the speed tracking error to a threshold; and if the ECU determines compressor surge is occurring, derate the compressor speed to reduce compressor speed below the commanded compressor speed.

4. The vapor cycle cooling system of claim 1, wherein the ECU is configured to determine whether compressor surge is occurring by analyzing the motor speed to determine a degree of oscillation of the motor speed, and identify compressor surge when the degree of oscillation of the motor speed exceeds a threshold; and if the ECU determines compressor surge is occurring, derate the compressor speed to reduce compressor speed below the commanded compressor speed.

5. The vapor cycle cooling system of claim 1, wherein the ECU is configured to determine whether compressor surge is occurring by analyzing the motor torque to determine a degree of oscillation of the motor torque, and identify compressor surge when the degree of oscillation of the motor torque exceeds a threshold; and if the ECU determines compressor surge is occurring, derate the compressor speed to reduce compressor speed below the commanded compressor speed.

6. The vapor cycle cooling system of claim 1, wherein the ECU is configured to determine whether compressor surge is occurring by analyzing the motor current to determine a degree of oscillation of the motor current, and identify compressor surge when the degree of oscillation of the motor current exceeds a threshold; and if the ECU determines compressor surge is occurring, derate the compressor speed to reduce compressor speed below the commanded compressor speed.

7. A battery electric or hybrid vehicle comprising a battery configured to provide motive power to the vehicle and the vapor cycle cooling system of claim 1, wherein the vapor cycle cooling system is coupled to the battery to provide thermal management thereto.

8. A method of controlling a recirculation valve in a compressor system, the compressor having an inlet and an outlet, and the recirculation valve coupled to the compressor system to controllably deliver fluid to the compressor inlet to increase mass flow therethrough, wherein the compressor is operable within conditions determined by a compressor map having a surge line, the compressor is coupled to a compressor motor and an engine control unit and the system comprises an electronic control unit (ECU); the method comprising:

estimating or sensing a mass flow rate through the compressor;

estimating or sensing each of a first pressure upstream at the compressor inlet, and a second pressure at the compressor outlet;

calculating a distance from a current operating point, using the mass flow rate and a ratio of the first and second pressures, to the surge line on the compressor map;

controlling position of the recirculation valve with a controller taking the distance as an input;

the ECU controlling the compressor motor by receiving a commanded speed, and controlling current to the motor or torque generated by the motor;

the ECU determining a parameter of motor operation;

the ECU analyzing variance or oscillation of the parameter of motor operation to identify compressor surge; and the ECU determining that compressor surge is occurring and derating compressor speed to reduce compressor speed below the commanded compressor speed;

wherein the parameter of motor operation is one of motor speed, motor torque, and motor current.

9. The method of claim 8, wherein the controller applies a proportional-integral control method.

10. The method of claim 8, wherein the motor operates at an actual motor speed;

the ECU determines a speed tracking error as a difference between the commanded speed and the actual motor speed; and the ECU is configured to determine that compressor surge is occurring by analyzing a variance of the speed tracking error, and comparing the variance of the speed tracking error to a threshold.

11. The method of claim 8, wherein the ECU is configured to determine that compressor surge is occurring by analyzing the motor speed to determine a degree of oscillation of the motor speed, and identifying surge when the degree of oscillation of the motor speed exceeds a threshold.

12. The method of claim 8, wherein the ECU is configured to determine that compressor surge is occurring by analyzing the motor torque to determine a degree of oscillation of the motor torque, and identifying surge when the degree of oscillation of the motor torque exceeds a threshold.

13. The method of claim 8, wherein the ECU is configured to determine that compressor surge is occurring by analyzing the motor current to determine a degree of oscillation of the motor current, and identifying surge when the degree of oscillation of the motor current exceeds a threshold.

* * * * *